United States Patent
Baek

(10) Patent No.: US 7,608,878 B2
(45) Date of Patent: Oct. 27, 2009

(54) SEMICONDUCTOR DEVICE MANUFACTURED WITH A DOUBLE SHALLOW TRENCH ISOLATION PROCESS

(75) Inventor: Seung Joo Baek, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 228 days.

(21) Appl. No.: 11/647,324

(22) Filed: Dec. 29, 2006

(65) Prior Publication Data

US 2008/0003774 A1    Jan. 3, 2008

(30) Foreign Application Priority Data

Jun. 30, 2006    (KR)    ............ 10-2006-0060088

(51) Int. Cl.
*H01L 29/739*    (2006.01)

(52) U.S. Cl. ............ 257/296; 257/E29.2; 257/E29.201; 257/E21.545; 257/E21.549; 438/248; 438/259; 438/270; 438/391

(58) Field of Classification Search .............. 257/E29.2, 257/E29.201, E21.545, E21.549; 438/248, 438/259, 270, 391
See application file for complete search history.

(56) References Cited

U.S. PATENT DOCUMENTS 6,476,444 B1 * 11/2002 Min ........................ 257/330

2005/0001252 A1 * 1/2005 Kim et al. .................. 257/296
2005/0035427 A1 * 2/2005 Park et al. .................. 257/510
2005/0285204 A1   12/2005 Kim et al.
2006/0001107 A1 * 1/2006 Kim et al. .................. 257/374

FOREIGN PATENT DOCUMENTS

| KR | 1020020075008 A | 10/2002 |
| KR | 1020020091916 A | 12/2002 |
| KR | 1020050018187 A | 2/2005 |
| KR | 1020060072962 A | 6/2006 |
| KR | 1020060077543 A | 7/2006 |
| KR | 1020060102878 A | 9/2006 |

* cited by examiner

*Primary Examiner*—Thanh V Pham
(74) *Attorney, Agent, or Firm*—Townsend and Townsend and Crew LLP

(57) ABSTRACT

A method for manufacturing a semiconductor device includes forming a device isolation film by a double Shallow Trench Isolation (STI) process, forming a first active region having a negative slope and a second active region having a positive slope. Additionally, the method includes applying a recess region and a bulb-type recess region to the above-extended active region so as to prevent generation of horns in the active regions. This structure results in improvement in effective channel length and area.

6 Claims, 12 Drawing Sheets

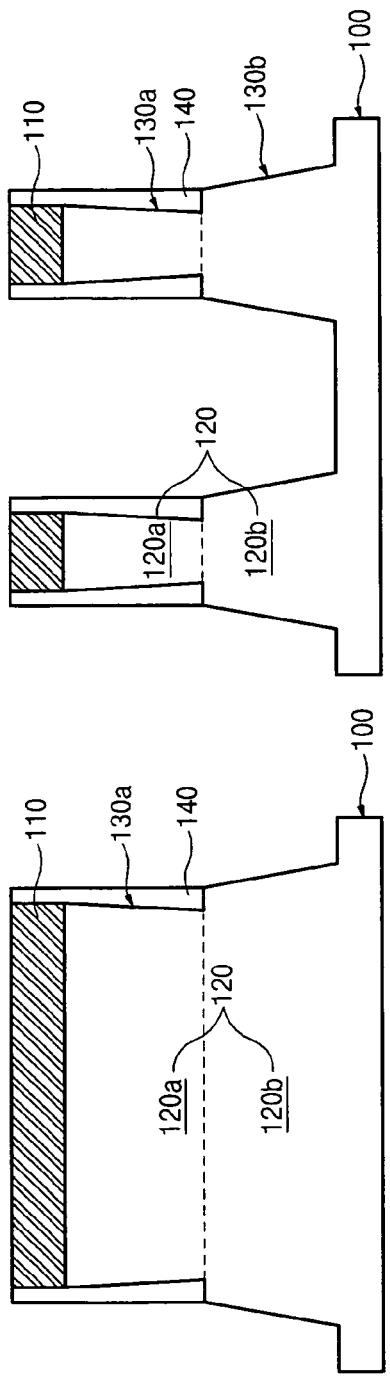
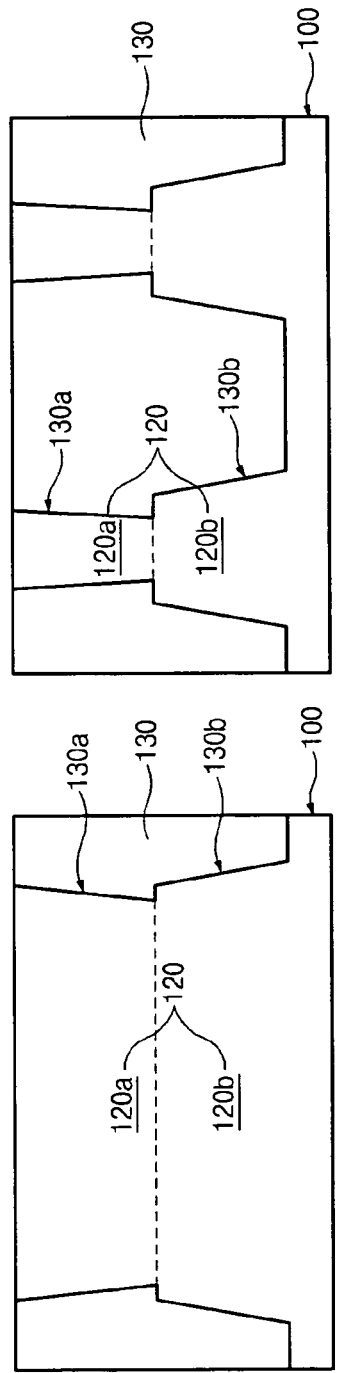
Fig.11c
Fig.11d

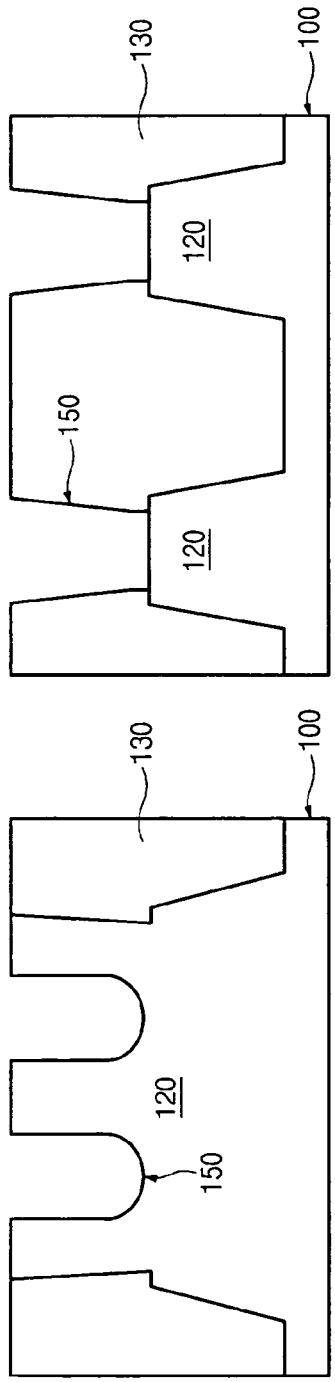
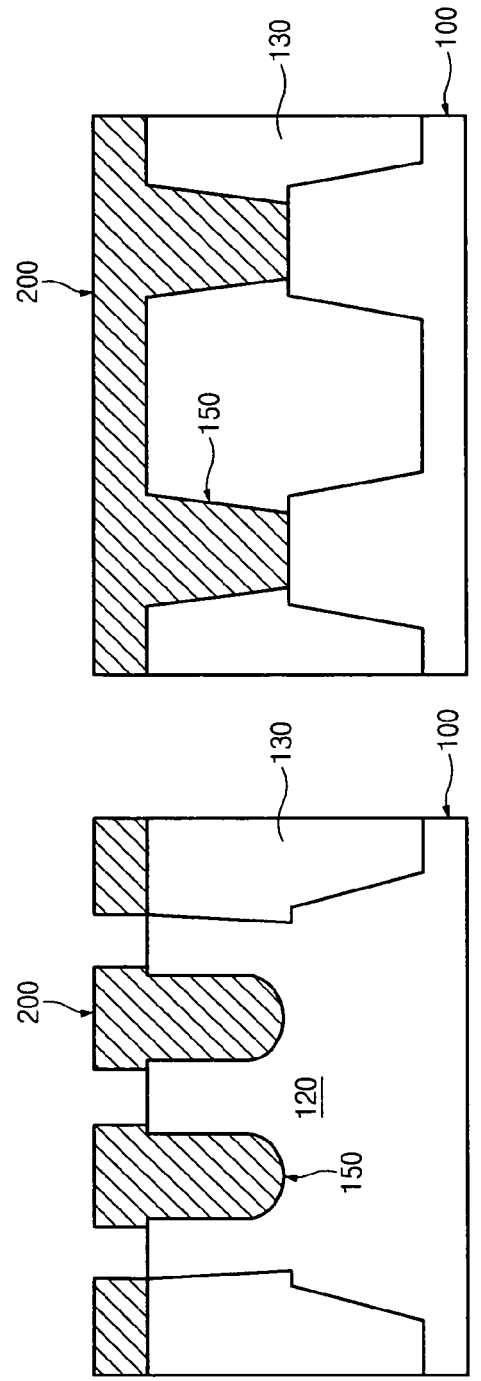
Fig.11e
Fig.11f

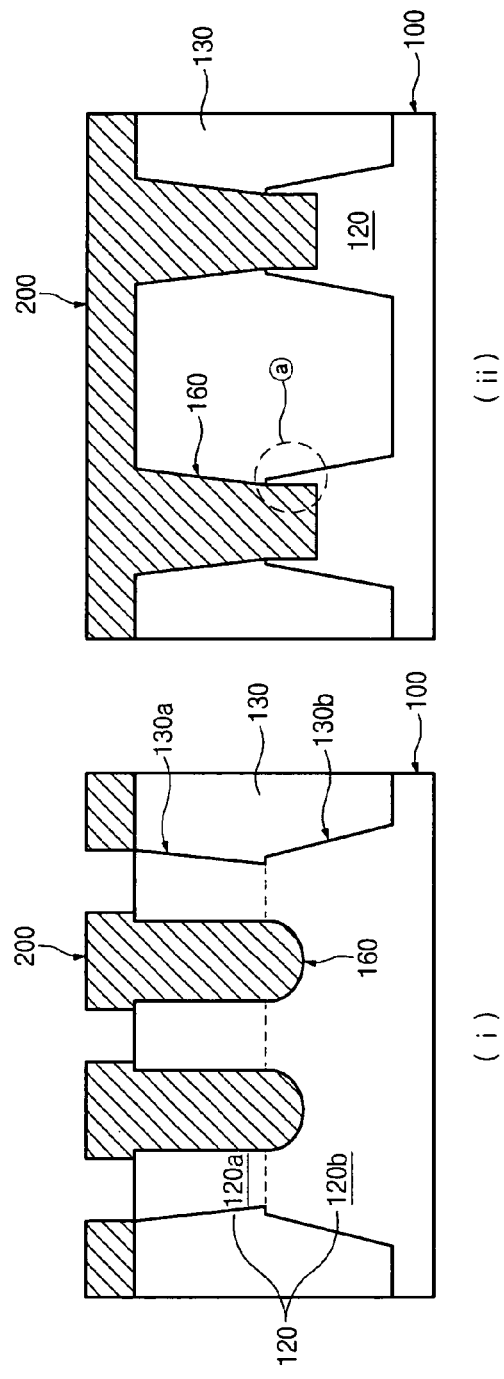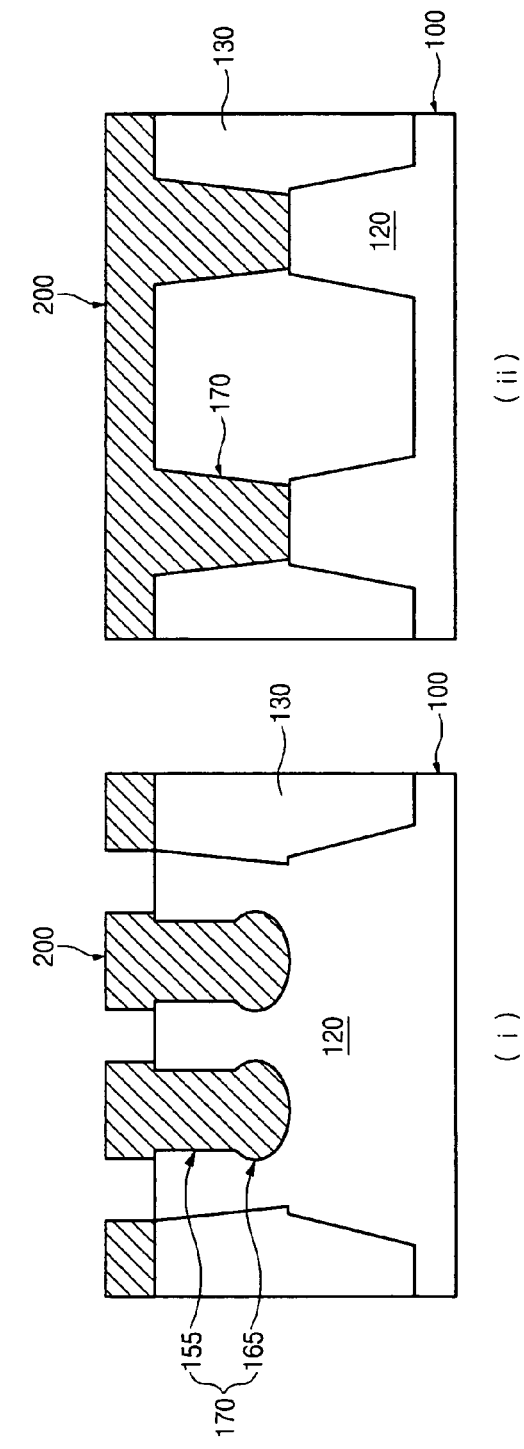
Fig. 12
Fig. 13

SEMICONDUCTOR DEVICE MANUFACTURED WITH A DOUBLE SHALLOW TRENCH ISOLATION PROCESS

CROSS-REFERENCES TO RELATED APPLICATIONS

The present application claims priority to Korean patent application number 10-2006-0060088, filed on Jun. 30, 2006, which is incorporated by reference in its entirety.

BACKGROUND OF THE INVENTION

The present invention generally relates to a semiconductor device and a method for manufacturing the same, and more specifically, to a technology of forming a device isolation film by a double Shallow Trench Isolation (STI) process, forming a first active region having a negative slope and a second active region having a positive slope and applying a recess region and a bulb-type recess region to the above-extended active region so as to prevent generation of horns in the active regions and to improve a channel length and area effectively.

As a result of high integration of semiconductor devices, a process margin for forming an active region and a device isolation film has been reduced. As a line width of a gate has become narrower, the channel length has also been reduced to degrade electric characteristics of semiconductor devices and generate a short channel effect. In order to prevent the degradation of semiconductor devices and the generation of the short channel effect, a recess gate obtained by etching a given depth of a semiconductor substrate of a local gate region has been used to increase the contact area between the active region and the gate and also increase the gate channel length.

SUMMARY OF THE INVENTION

Various embodiments are directed at providing a semiconductor device and a method for manufacturing the same that includes forming a device isolation film by a double STI process, forming a first active region having a negative slope and a second active region having a positive slope and applying a recess region and a bulb-type recess region to the above-extended active region so as to prevent generation of horns in the active regions and to improve a channel length and an area effectively.

According to an embodiment of the present invention, a semiconductor device comprises a first trench having a negative slope over a semiconductor substrate, a second trench obtained by etching the lower part of the first trench to have a smaller width than that of the first trench and have a positive slope, a device isolation film for filling the first and second trenches, an active region defined by the device isolation film, and a gate formed over the active region.

The gate includes a recess gate whose recess region overlapped with the active region is etched. The recess region has the active region whose center defined by the second trench is etched at a given depth, that is, whose cross-section taken along a gate direction is formed to have a 'U' shape along a line width of the active region defined by the first trench.

The gate includes a bulb-type recess gate obtained by iso-tropic-etching a first recess region formed in the active region overlapped with the gate and the lower part of the first recess region. The first recess region has the active region whose center defined by the second trench is etched at a given depth, that is, whose cross-section taken along a gate direction is formed to have a 'U' shape along a line width of the active region defined by the first trench.

According to an embodiment of the present invention, a method for manufacturing a semiconductor device comprises the steps of: forming a first trench having a negative slope that defines an active region over a semiconductor substrate and whose sidewall gets wider downward; forming a hard mask barrier layer over the semiconductor substrate; etching the lower part of the first trench with the hard mask barrier layer as an etching barrier wall to form a second trench having a positive slope whose sidewall becomes narrower; removing the hard mask barrier layer; forming a device isolation film for filling the first and second trenches; and forming a gate over the semiconductor substrate.

The first trench has a depth ranging from about 1,000 to about 5,000 Å. The hard mask barrier layer is formed with one selected from the group consisting of a carbon layer, an oxide silicon nitride film and combinations thereof, with its thickness ranging from about 10 to about 500 Å. The second trench has a depth ranging from about 1,000 to about 5,000 Å. A sidewall barrier layer is further formed at sidewalls of the first and second trenches. The sidewall barrier layer is formed with one selected from the group consisting of an oxide film, a nitride film and combinations thereof, with its thickness ranging from about 20 to about 200 Å.

According to an embodiment of the present invention, a method for manufacturing a semiconductor device comprises the steps of: forming a first trench having a negative slope that defines an active region over a semiconductor substrate and whose sidewall gets wider downward; forming a hard mask barrier layer over the semiconductor substrate; etching the lower part of the first trench with the hard mask barrier layer as an etching barrier wall to form a second trench having a positive slope whose sidewall becomes narrower; removing the hard mask barrier layer; forming a device isolation film for filling the first and second trenches; etching active regions defined by the device isolation film and overlapped with a subsequent gate to form a recess region; and forming a gate over the semiconductor substrate including the recess region.

The first trench has a depth ranging from about 1,000 to about 5,000 Å. The hard mask barrier layer is formed with one selected from the group consisting of a carbon layer, an oxide silicon nitride film and combinations thereof, with its thickness ranging from about 10 to about 500 Å. The second trench has a depth ranging from about 1,000 to about 5,000 Å. A sidewall barrier layer is further formed at sidewalls of the first and second trenches. The sidewall barrier layer is formed with one selected from the group consisting of an oxide film, a nitride film and combinations thereof, with its thickness ranging from about 20 to about 200 Å. The recess region has a depth ranging from about 1,000 to about 5,000 Å.

The recess region has the active region whose center defined by the second trench is etched at a given depth, that is, whose cross-section taken along a gate direction is formed to have a 'U' shape along a line width of the active region defined by the first trench. The active region defined by the second trench is etched so that the height of the 'U'-shaped portion ranges from about 100 to about 2,000 Å.

According to an embodiment of the present invention, a method for manufacturing a semiconductor device comprises the steps of: forming a first trench having a negative slope that defines an active region over a semiconductor substrate and whose sidewall gets wider downward; forming a hard mask barrier layer over the semiconductor substrate; etching the lower part of the first trench with the hard mask barrier layer as an etching barrier wall to form a second trench having a positive slope whose sidewall becomes narrower; removing the hard mask barrier layer; forming a device isolation film for filling the first and second trenches; etching active regions defined by the device isolation film and overlapped with a subsequent gate to form a first recess region; isotropic-etching the lower part of the first recess region to form a second recess region and a bulb-type recess region including the first and second recess regions; and forming a gate over the semiconductor substrate including the bulb-type recess region.

The first trench has a depth ranging from about 1,000 to about 5,000 Å. The hard mask barrier layer is formed with one selected from the group consisting of a carbon layer, an oxide silicon nitride film and combinations thereof, with its thickness ranging from about 10 to about 500 Å. The second trench has a depth ranging from about 1,000 to about 5,000 Å. A sidewall barrier layer is further formed at sidewalls of the first and second trenches. The sidewall barrier layer is formed with one selected from the group consisting of an oxide film, a nitride film and combinations thereof, with its thickness ranging from about 20 to about 200 Å. The first recess region has a depth ranging from about 1,000 to about 5,000 Å. The second recess region has a depth and line width ranging from about 100 to about 2,000 Å.

The first recess region has the active region whose center defined by the second trench is etched at a given depth, that is, whose cross-section taken along a gate direction is formed to have a 'U' shape along a line width of the active region defined by the first trench. The active region defined by the second trench is etched so that the height of the 'U'-shaped portion ranges from about 100 to about 2,000 Å.

BRIEF DESCRIPTION OF THE DRAWINGS

FIGS. 5(i) and 5(ii) are cross-sectional diagrams illustrating a semiconductor device and a method for manufacturing the same according to an embodiment of the present invention.

FIGS. 7(i) and 7(ii) are cross-sectional diagrams illustrating a semiconductor device according to an embodiment of the present invention.

FIGS. 8(i) and 8(ii) are cross-sectional diagrams illustrating a semiconductor device according to an embodiment of the present invention.

FIGS. 9(i) and 9(ii) are cross-sectional diagrams illustrating a semiconductor device according to an embodiment of the present invention.

FIGS. 10(i) and 10(ii) are cross-sectional diagrams illustrating a semiconductor device according to an embodiment of the present invention.

FIGS. 11a through 11f are cross-sectional diagrams illustrating a method for manufacturing a semiconductor device according to an embodiment of the present invention.

FIGS. 12(i) and 12(ii) are cross-sectional diagrams illustrating a method for manufacturing a semiconductor device according to an embodiment of the present invention.

FIGS. 13(i) and 13(ii) are cross-sectional diagrams illustrating a method for manufacturing a semiconductor device according to an embodiment of the present invention.

FIGS. 14(i) and 14(ii) are cross-sectional diagrams illustrating a method for manufacturing a semiconductor device according to an embodiment of the present invention.

DETAILED DESCRIPTION OF THE EXEMPLARY EMBODIMENTS

The present invention will be described in detail with reference to the accompanying drawings.

Figure 1:
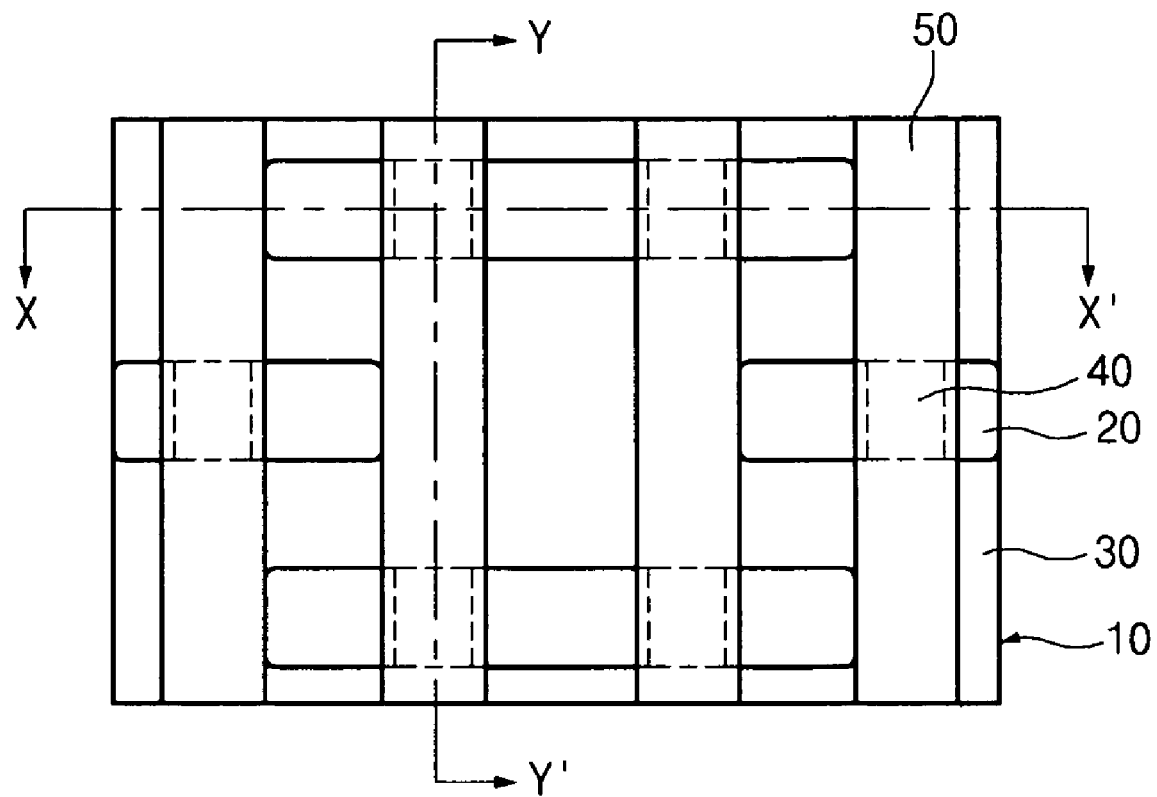
FIG. 1 is a plane diagram illustrating a conventional semiconductor device.

FIG. 1 is a plane diagram illustrating a conventional semiconductor device.

An active region 20 and a device isolation film 30 are formed over a semiconductor substrate 10, and a recess region 40 obtained by etching the active region 20 of a local gate region is formed. A gate 50 is formed for filling the recess region 40.

Figure 2:
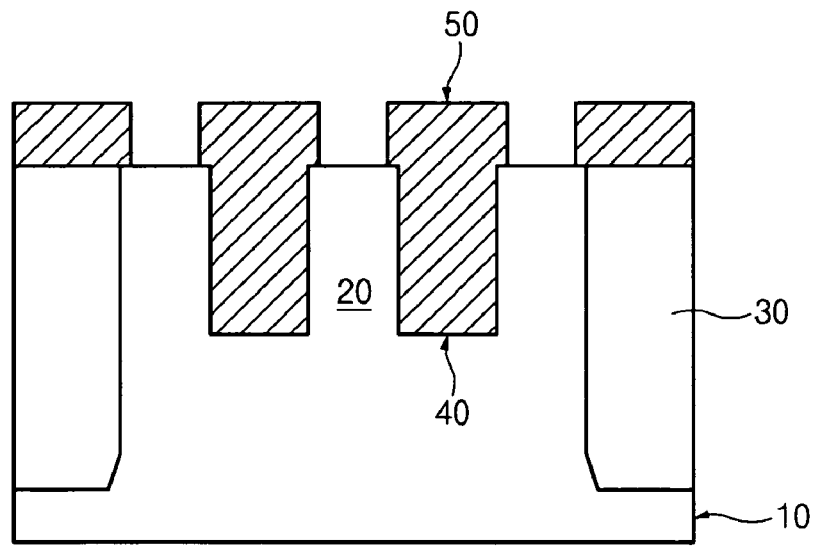
FIGS. 2 and 3 are cross-sectional diagrams illustrating a conventional semiconductor device.
Figure 3:
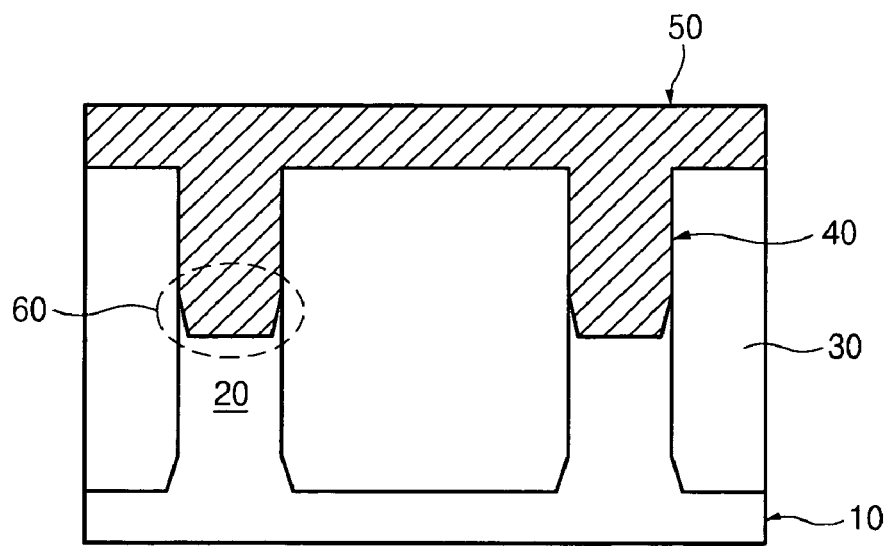

FIGS. 2 and 3 are cross-sectional diagrams illustrating a conventional semiconductor device.

FIG. 2 shows a cross-section taken along a direction XX'. The gate is formed over the recess region 40, and a channel length is shown to increase by the recess region 40 in the length direction of the gate 50.

However, there is a limit in increasing of the channel length with the recess region as semiconductor devices become smaller. The channel area determined by the active region has been reduced so as to decrease operation current. As a result, the electric characteristics of semiconductor devices are degraded.

FIG. 3 shows a cross-section taken along a direction YY'. As the line width of the active region 20 has been reduced, a process margin for etching the recess region 40 is limited. The active region 20 is not etched in the lower part of the recess region 40 so that the active region 20 remains as a horn-shape to generate a horn 60. The horn 60 is generated by defects in a subsequent process to degrade the electric characteristics of semiconductor devices.

As mentioned above, the process margin for forming a device isolation film and an active region in a high-integrated semiconductor device has been reduced, and a recess region formed to improve an electric characteristic of a gate serves as a factor which generates defects of the semiconductor device.

Figure 4:
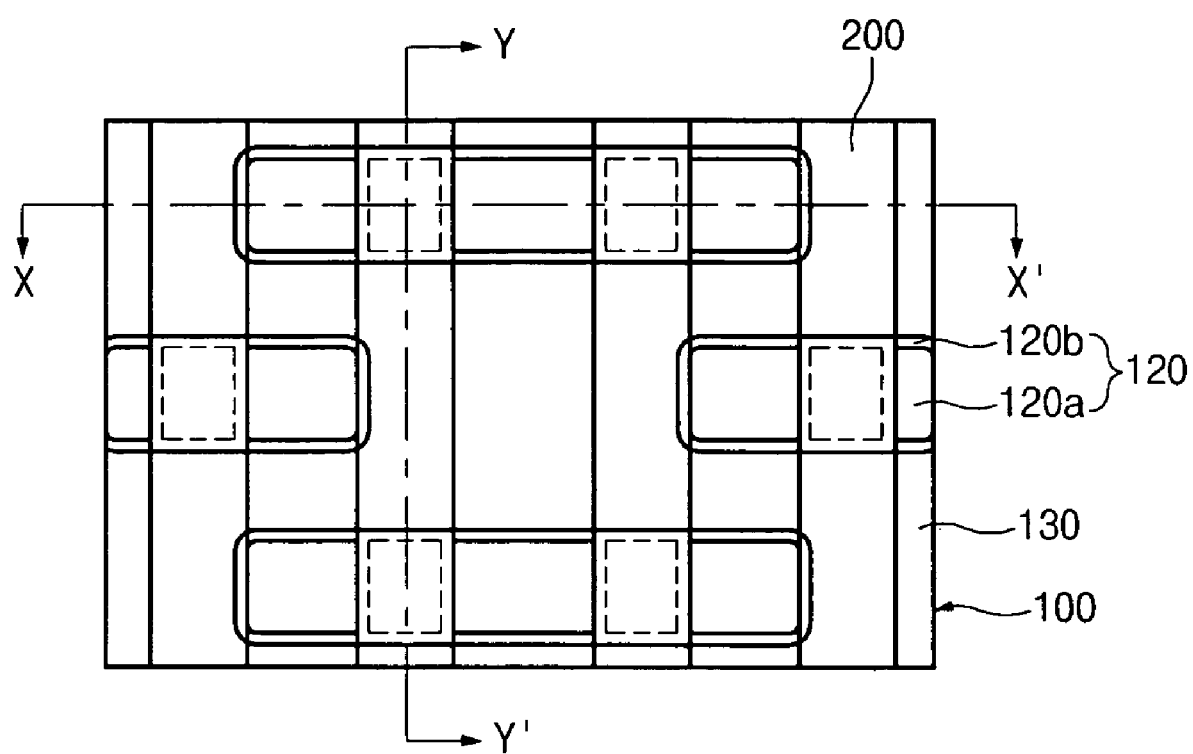
FIG. 4 is a plane diagram illustrating a semiconductor device according to an embodiment of the present invention.

FIG. 4 is a plane diagram illustrating a semiconductor device according to an embodiment of the present invention.

A first bar-type active region 120a defined by a first trench is formed over a semiconductor substrate 100. The lower part of the first trench is etched to form a second active region 120b defined by a second trench having a given width narrower than that of the first trench. A device isolation film 130 is formed for filling the first and second trenches. As the second trench becomes smaller, the second active region 120b whose area becomes larger than that of the first active region 120a is formed in the bottom of the first active region 120a. Although the second active region 120b is not shown in FIG. 4, FIG. 4 shows the area increment of the first active region 120a. A gate 200 is formed perpendicular to the length direction of the active region 120.

Figure 5:
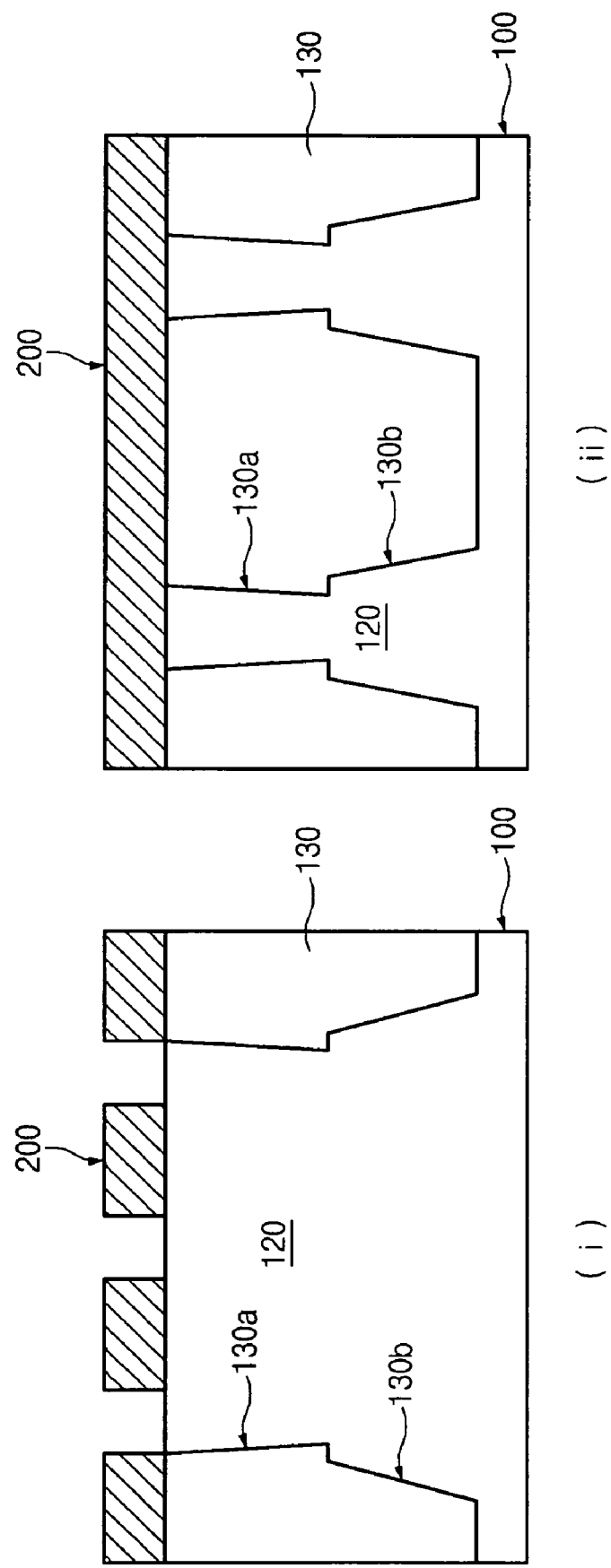

FIG. 5 is a cross-sectional diagram illustrating a semiconductor device and a method for manufacturing the same according to an embodiment of the present invention. (i) shows a cross-section taken along a direction XX' of FIG. 4 and (ii) shows a cross-section taken along a direction YY' of FIG. 4.

A first trench 130a that defines a bar-type active region 120 is formed over a semiconductor substrate 100 to have a negative slope whose sidewall becomes wider downward based on a device separating region. The first trench 130a is formed to have a depth ranging from about 1,000 to about 5,000 Å by a Shallow Trench Isolation (STI) process.

A hard mask barrier layer (not shown) is formed over the semiconductor substrate 100. The low part of the first trench 130a is etched with the hard mask barrier layer to form a second trench 130b having a positive slope whose sidewall becomes narrower downward. The hard mask barrier layer is formed with one selected from the group consisting of a carbon layer, an oxide silicon nitride film and combinations thereof, with its thickness ranging from about 10 to about 500 Å. Since the low part of the first trench is etched with the hard mask barrier layer as an etching sidewall, the second trench 130b becomes smaller by 10-500 Å than the first trench so that the active region becomes larger relatively. The second trench 130b is formed to have a depth ranging from about 1,000 to about 5,000 Å by a STI process. In this way, the device separating trenches are formed by the double STI process to secure an etching margin and increase the area of the active region and the channel area, thereby improving the current driving capacity.

The hard mask barrier layer is removed to fill a device isolation film 130 in the first and second trenches 130a and 130b. The device isolation film 130 includes a High Density Plasma (HDP) oxide film. In order to protect sidewalls of the trenches, a sidewall barrier layer (not shown) is further formed at sidewalls of the first and second trenches 130a and 130b to fill the device isolation film 130. The sidewall barrier layer is formed with one selected from the group consisting of an oxide film, a nitride film and combinations thereof, with its thickness ranging from about 20 to about 200 Å.

A gate 200 is formed over the semiconductor substrate 100. Specifically, a gate oxide film, a gate polysilicon layer, a gate metal layer and a hard mask layer are sequentially deposited over the semiconductor substrate 100. An etching process is performed on the deposition structure with a gate mask to obtain the gate 200.

Figure 6:
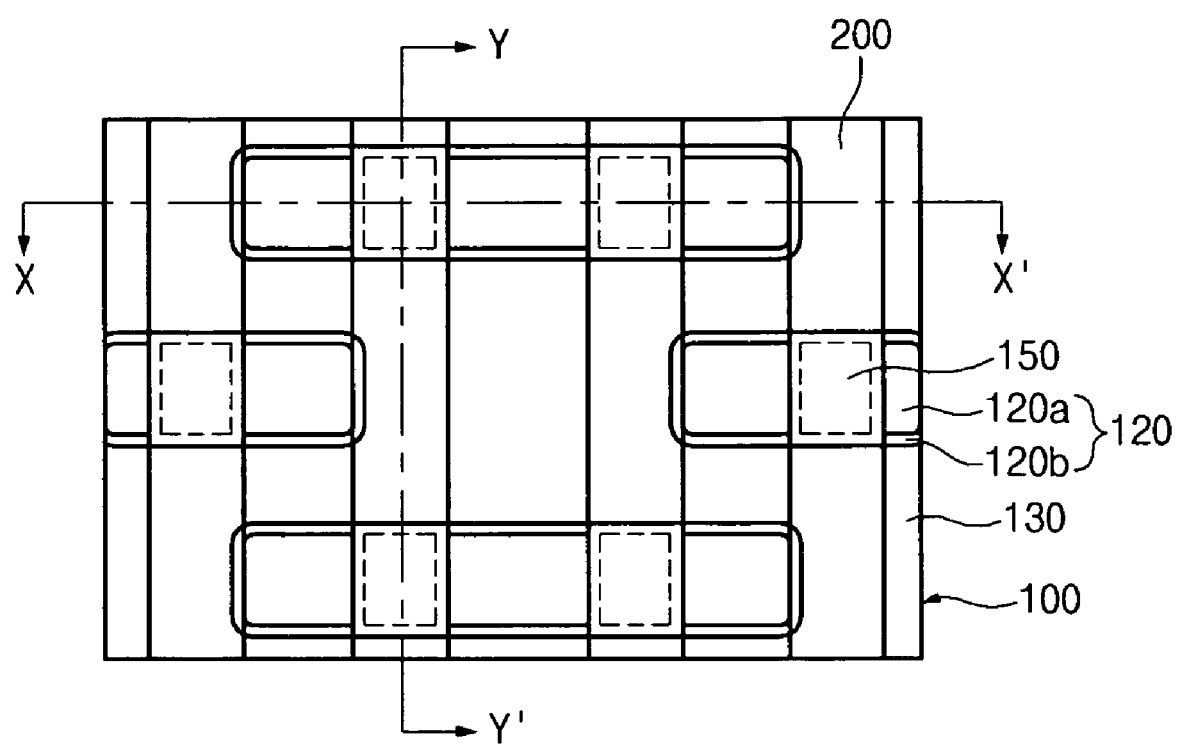
FIG. 6 is a plane diagram illustrating a semiconductor device according to an embodiment of the present invention.

FIG. 6 is a plane diagram illustrating a semiconductor device according to an embodiment of the present invention.

The semiconductor device of FIG. 6 is formed to have the same structure as that of FIG. 4 so that the semiconductor device comprises an extended active region 120. The active region 120 whose portion is overlapped with a gate 200 is etched to form a recess region 150 for increasing a channel length of the gate 200. The recess region 150 is formed perpendicular to the uni-axial direction of the first active region 120a to have a narrower line-width than that of the gate 200.

Figure 7:
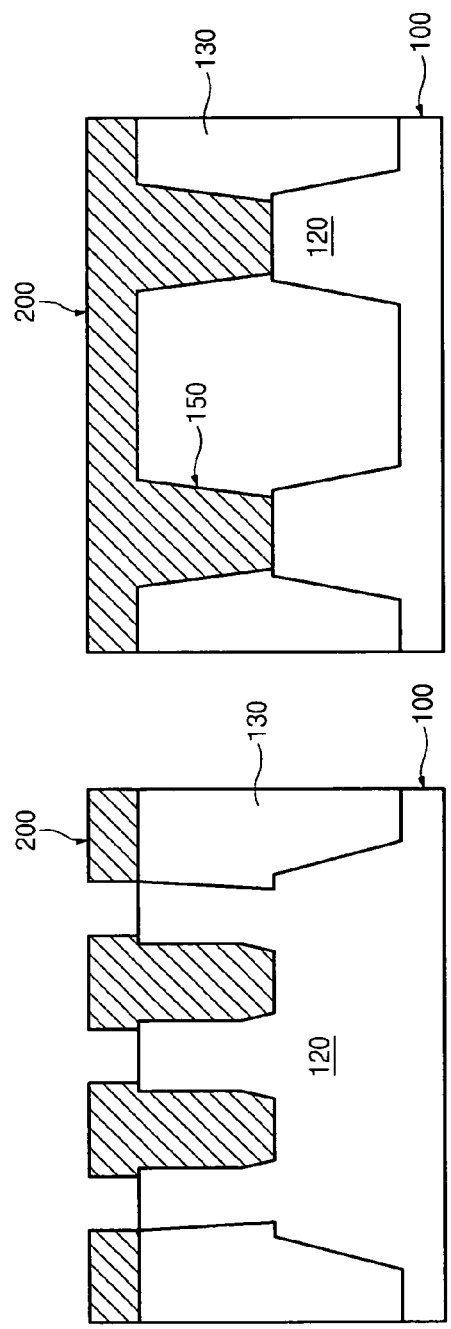

FIG. 7 is a cross-sectional diagram illustrating a semiconductor device according to an embodiment of the present invention. (i) shows a cross-section taken along a direction XX' of FIG. 6 and (ii) shows a cross-section taken along a direction YY' of FIG. 6.

The double STI process is performed, as shown in FIG. 5, to form the active region 120 having a stair-shaped sidewall. The active region of the local gate region is etched to form the recess region 150. The gate 200 is formed for filling the recess region 150. since the top of the active region 120 having the recess region 150 has a negative slope, no horns are formed in the bottom of the recess region 150.

Figure 8:
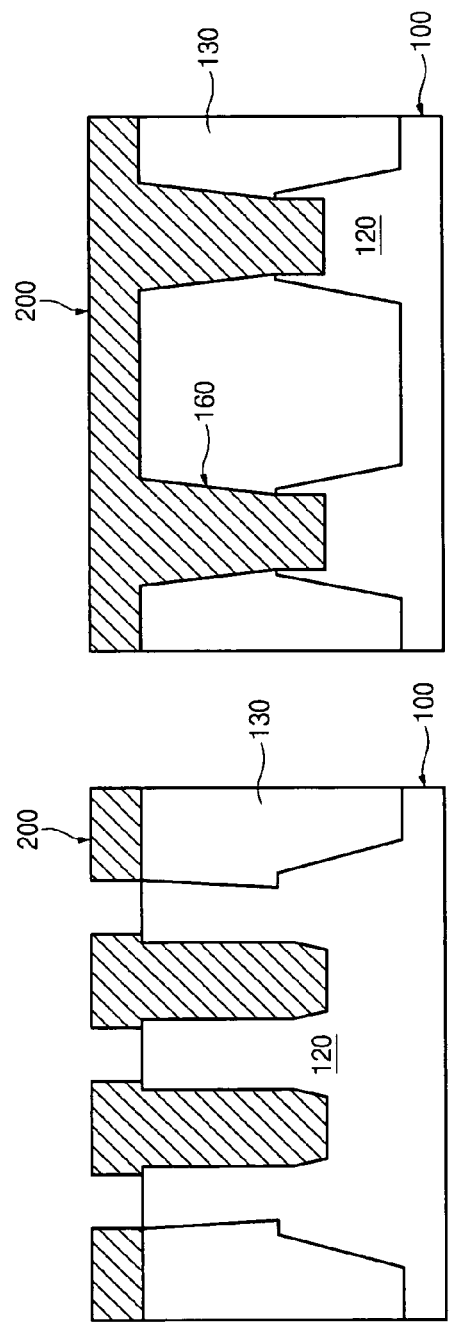

FIG. 8 is a cross-sectional diagram illustrating a semiconductor device according to an embodiment of the present invention.

A recess region 160 is formed to have the same structure as that of FIG. 7. Along a line width of a first active region 120a defined by a first trench 130a, a second active region 120b defined by a second trench 130b is further etched at a given depth. That is, the active region 120 including the recess region 160 in the gate direction has a cross-section cut in the gate direction to have a 'U' shape (see (ii) of FIG. 8).

Figure 9:
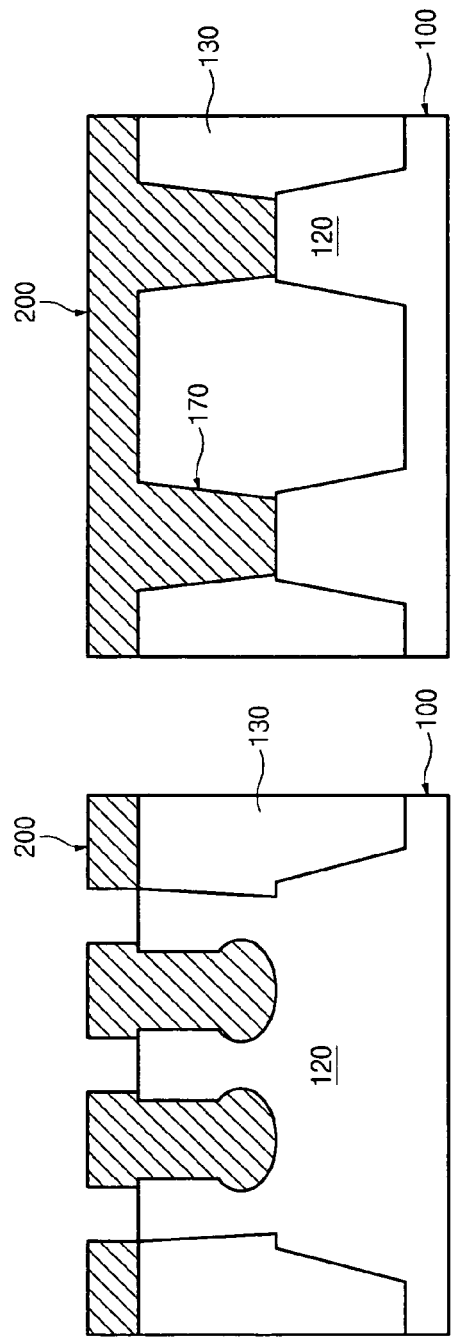

FIG. 9 is a cross-sectional diagram illustrating a semiconductor device according to an embodiment of the present invention.

A bulb-type recess region 170 is formed over an active region 120 by a double STI process. The increase of the active region by the double STI process increases the channel area, and the bulb-type recess region 170 increases the channel length, thereby improving electric characteristics of the gate effectively.

Figure 10:
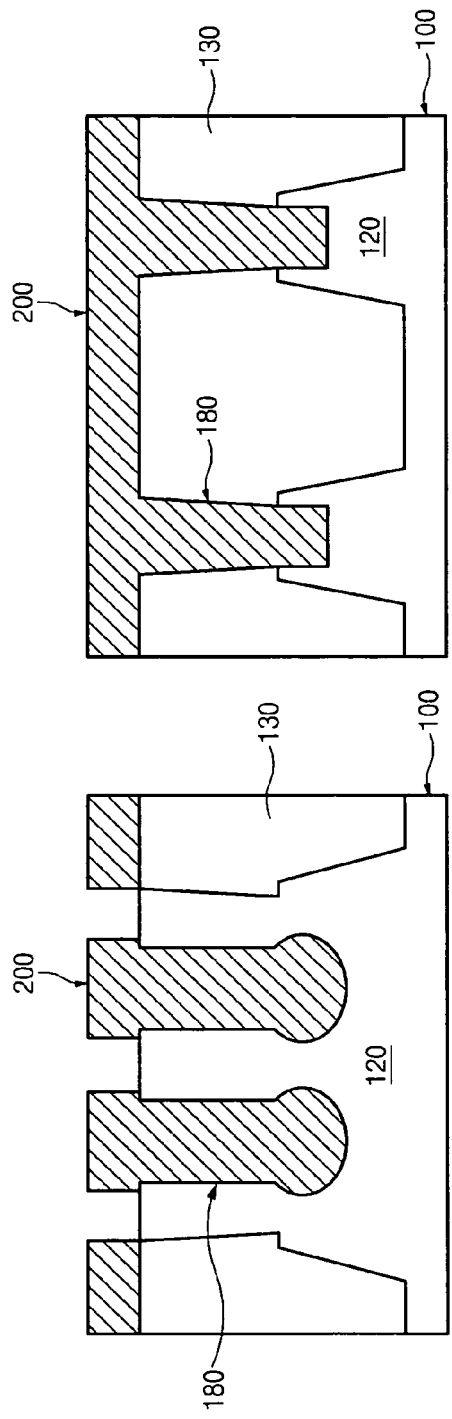
Figure 11A:
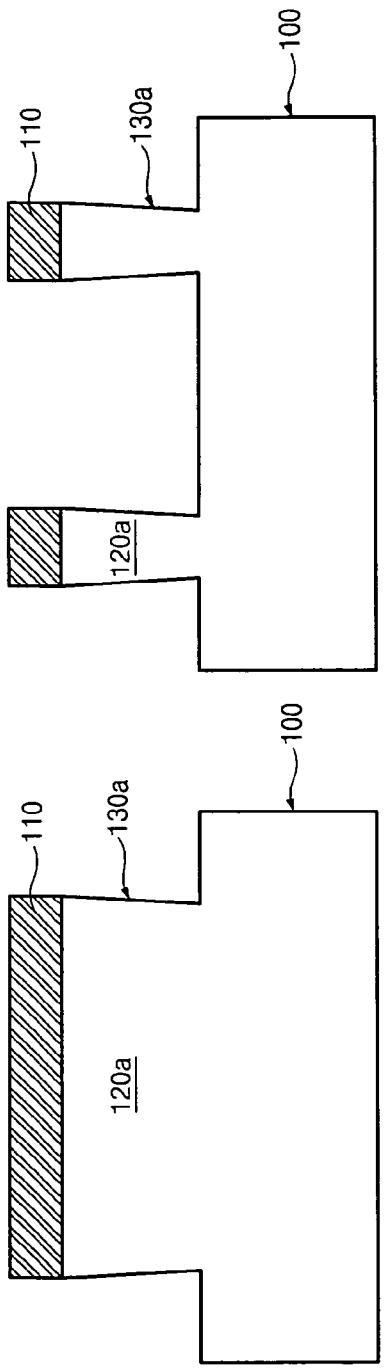
Figure 11B:
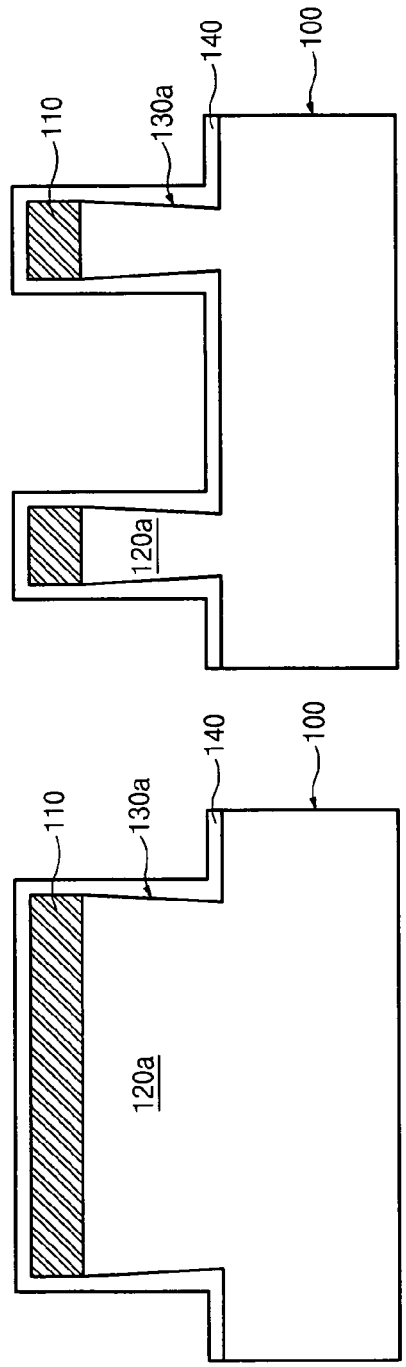

FIG. 10 is a cross-sectional diagram illustrating a semiconductor device according to an embodiment of the present invention.

(i) and (ii) of FIG. 10 are combinations of FIG. 8 and FIG. 9. As shown in FIG. 8, the bulb-type recess region 180 is formed to be longer so that the active region 120 including the bulb-type recess region 180 is formed to have a 'U' shape.

FIGS. 11a through 11f are cross-sectional diagrams illustrating a method for manufacturing a semiconductor device according to an embodiment of the present invention. (i) shows a cross-section taken along a direction XX' of FIG. 6 and (ii) shows a cross-section taken along a direction YY' of FIG. 6.

A hard mask pattern 110 that defines the first bar-type active region 120a is formed over the semiconductor substrate 100. The hard mask pattern 110 has a deposition structure including a pad oxide film and a pad nitride film. The semiconductor substrate 100 is etched at a given depth with the hard mask pattern 110 as an etching sidewall to form the first trench 130a that defines the first active region 120a. The first trench 130a is formed at a depth ranging from about 1,000 to about 5,000 Å by a STI process to have a negative slope whose sidewall of the first trench 130a becomes wider.

The hard mask barrier layer 140 is formed over the semiconductor substrate. The hard mask barrier layer 140 is formed with one selected from the group consisting of a carbon layer, an oxide silicon nitride film and combinations thereof, with its thickness ranging from about 10 to about 500 Å.

An etch-back process is performed so that the hard mask barrier layer 140 remains at sidewalls of the hard mask pattern 110 and the first trench 130a. The low part of the first trench 130a is etched with the hard mask pattern 110 and the hard mask barrier layer 140 as etching barriers to form the second trench 130b that defines the second active region 120b. The second trench 130b is formed at a depth ranging from about 1,000 to about 5,000 Å by a STI process to have a positive slope whose sidewall becomes narrower. The double STI process is performed to form the device separating trenches to secure the etching margin of the trenches. The sidewalls of the first and second active regions 120a and 120b are formed to have a stair-shaped step difference. As a result, the active region 120 is formed to increase the channel area corresponding to the step difference portion, increase the operating current and improve the current driving capacity.

The hard mask barrier layer 140 and the hard mask pattern 110 are removed, and the device isolation film 130 is filled in the first and second trenches 130a and 130b. The device isolation film 130 includes a HDP oxide film. In order to protect the sidewalls of the trenches, a sidewall barrier layer (not shown) is further formed at the sidewalls of the first and second trenches 130a and 130b to fill the device isolation film 130. The side barrier layer is formed with one selected from the group consisting of an oxide film, a nitride film and combinations thereof, with its thickness ranging from about 20 to about 200 Å.

A region where a subsequent gate is overlapped with the first active region 120a is etched to form the recess region 150 that increases the channel length. The active region 120 overlapped with the gate is etched at a depth ranging from about 1,000 to about 5,000 Å, and the recess region 150 is formed to have a given width narrower than that of the gate. The recess region 150 which contacts with the device isolation film 130 has a bottom whose area becomes smaller. The cross-section of the active region 120 is formed to have a stair-shaped step difference. The stair-shaped step difference formed over the active region 120 is rounded to have a saddle type. As a result, there are no horns in the lower part of the recess region 150.

A gate oxide film (not shown) is formed over the recess region 150, and a gate polysilicon layer (not shown) is formed to fill the recess region 150. The gate polysilicon layer is planarized. A gate metal layer and a gate hard mask layer are sequentially deposited over the gate polysilicon layer. An etching process is performed to etch the deposition structure with a gate mask, thereby obtaining the gate 200.

FIG. 12 is a cross-sectional diagram illustrating a method for manufacturing a semiconductor device according to an embodiment of the present invention.

By the same processes as shown in FIGS. 11a through 11e, the recess region 160 is formed. The second active region 120b is further etched at a given depth along the lower line width of the first active region 120a defined by the first trench 130a. That is, the active region 120 including the recess region 160 has a cross-section cut in the gate direction to have a 'U' shape (see (ii) of FIG. 12). The height of the 'U' shape portion (a) ranges from about 100 to about 2,000 Å.

FIG. 13 is a cross-sectional diagram illustrating a method for manufacturing a semiconductor device according to an embodiment of the present invention.

The recess region 150 of FIG. 11e corresponds to a first recess region 155. The low part of the first recess region 155 is isotropic-etched to form a second recess region 165. As a result, a bulb-type recess region 170 including the first and second recess region 155 and 165 is formed. The first recess region 155 has a depth ranging from about 1,000 to about 5,000 Å, and the second recess region 165 has a depth and line width ranging from about 100 to about 2,000 Å. The bulb-type recess region 170 increases the channel length, thereby improving electric characteristics of the gate effectively.

Figure 14:
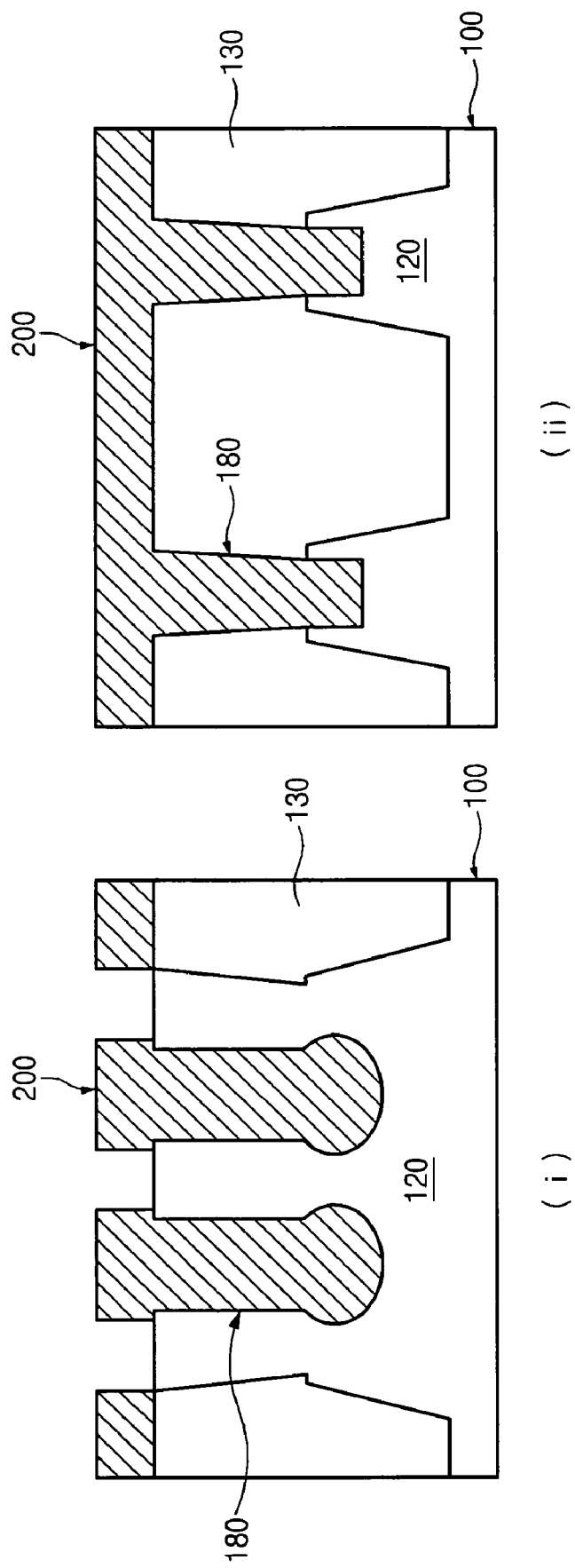

FIG. 14 is a cross-sectional diagram illustrating a method for manufacturing a semiconductor device according to an embodiment of the present invention.

A bulb-type recess region 180 is obtained by combining the examples of FIGS. 12 and 13. The cross-section of the active region 120 is formed to have a 'U' shape by the second recess region 165 which becomes a bulb portion of the bulb-type recess region. The second recess region has a depth and line width ranging from about 100 to about 2,000 Å, and the height of the 'U' shape portion ranges from about 100 to about 2,000 Å.

As described above, in a method for manufacturing a semiconductor device according to an embodiment of the present invention, a double STI process is performed to form a first trench having a negative slope, a first active region defined by the first trench, a second trench having a positive slope and a second active region defined by the second trench. The area of the second active region is increased to increase the operating current of a gate and improve gate characteristics. In order to increase the channel length, a local gate region of the first and second active regions is etched to form a recess region so that there are no horns in the recess region by the first trench having a negative slope. The recess region may be formed only in the first active region or may have a lower active region to have a 'U' shape. The recess region is formed to have a bulb-type, thereby increasing the gate channel length effectively.

Also, the double STI process is performed to form a device isolation film, thereby increasing the process margin. The sidewall of the active region is formed to have a stair shape, thereby increasing the bottom area of the active region to increase the channel area. When the recess region and the bulb-type recess region are applied in the above extended active region, there are no horns by the active region having a negative slope to increase the channel length and area effectively. Therefore, the method increases the process margin of semiconductor devices and electric characteristics of semiconductor devices.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor devices. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A semiconductor device comprising:
   a first trench formed in a semiconductor substrate, wherein sidewalls of the first trench have a negative slope;
   a second trench formed in the semiconductor substrate below the first trench such that the second trench is in communication with the first trench, wherein sidewalls of the second trench have a positive slope;
   a device isolation film for filling the first and second trenches;
   an active region defined by the device isolation film; and
   a gate formed over the active region, wherein the gate comprises a recess region,
   wherein a depth of the first trench is substantially equal to or greater than a depth of the recess region.

2. The semiconductor device according to claim 1, wherein a width of the first trench increases as the depth of the first trench increases.

3. The semiconductor device according to claim 1, wherein a width of the second trench decreases as a depth of the second trench increases.

4. The semiconductor device according to claim 1, wherein the recess region is disposed in the semiconductor substrate under the gate, a lower part of the recess region being 'U'-shaped in a longitudinal direction of the active region.

5. The semiconductor device according to claim 1, wherein the gate further comprises a bulb-type region disposed under the recess region, wherein the bulb-type region is spherically shaped by isotropic-etching a lower part of the recess region.

6. The semiconductor device according to claim 5, wherein the first recess region comprises the active region having a center defined by the second trench, the center being etched to a given depth, and
   wherein the bulb-type region is 'U'-shaped in a longitudinal direction of the active region.

\* \* \* \* \*